(12) United States Patent
Zheng et al.

(10) Patent No.: US 7,177,176 B2
(45) Date of Patent: Feb. 13, 2007

(54) SIX-TRANSISTOR (6T) STATIC RANDOM ACCESS MEMORY (SRAM) WITH DYNAMICALLY VARIABLE P-CHANNEL METAL OXIDE SEMICONDUCTOR (PMOS) STRENGTH

(75) Inventors: Bo Zheng, Beaverton, OR (US); Kevin Zhang, Portland, OR (US); Fatih Hamzaoglu, Hillsboro, OR (US); Yih (Eric) Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 10/883,609

(22) Filed: Jun. 30, 2004

(65) Prior Publication Data

US 2006/0002177 A1 Jan. 5, 2006

(51) Int. Cl.
*G11C 11/00* (2006.01)
*G11C 5/14* (2006.01)
*G11C 7/10* (2006.01)
(52) U.S. Cl. ............ 365/154; 365/189.05; 365/189.09; 365/189.11
(58) Field of Classification Search ................ 365/154
See application file for complete search history.

(56) References Cited

U.S. PATENT DOCUMENTS 6,166,985 A 12/2000 McDaniel et al.
2003/0090927 A1* 5/2003 Zhang et al. ............... 365/154
2004/0019703 A1* 1/2004 Burton ....................... 709/250
2005/0021606 A1* 1/2005 Davies et al. ............... 709/203
2005/0047196 A1* 3/2005 Bhavnagarwala et al. .. 365/154
2005/0213370 A1* 9/2005 Khellah et al. ............. 365/154
2005/0246568 A1* 11/2005 Davies ......................... 714/2

* cited by examiner

*Primary Examiner*—Amir Zarabian
*Assistant Examiner*—Ly Duy Pham
(74) *Attorney, Agent, or Firm*—Blakely, Sokoloff, Taylor & Zafman LLP

(57) ABSTRACT

In embodiments of the present invention, a static random access memory (SRAM) device has an array of memory cells in columns and rows. An individual memory cell includes two PMOS pull-up devices coupled to two NMOS pull-down devices. In READ mode and/or STANDBY/NO-OP mode of a column, the two PMOS pull-up devices are effectively strengthened by forward biasing the PMOS n-wells or by utilizing a lower threshold voltage PMOS device by implanting a lower halo dose in the PMOS device. In WRITE mode of a column, the two PMOS pull-up devices are effectively weakened by reverse biasing the PMOS n-wells or by coupling the sources of the NMOS devices to virtual ground ($V_{SSi}$).

8 Claims, 7 Drawing Sheets

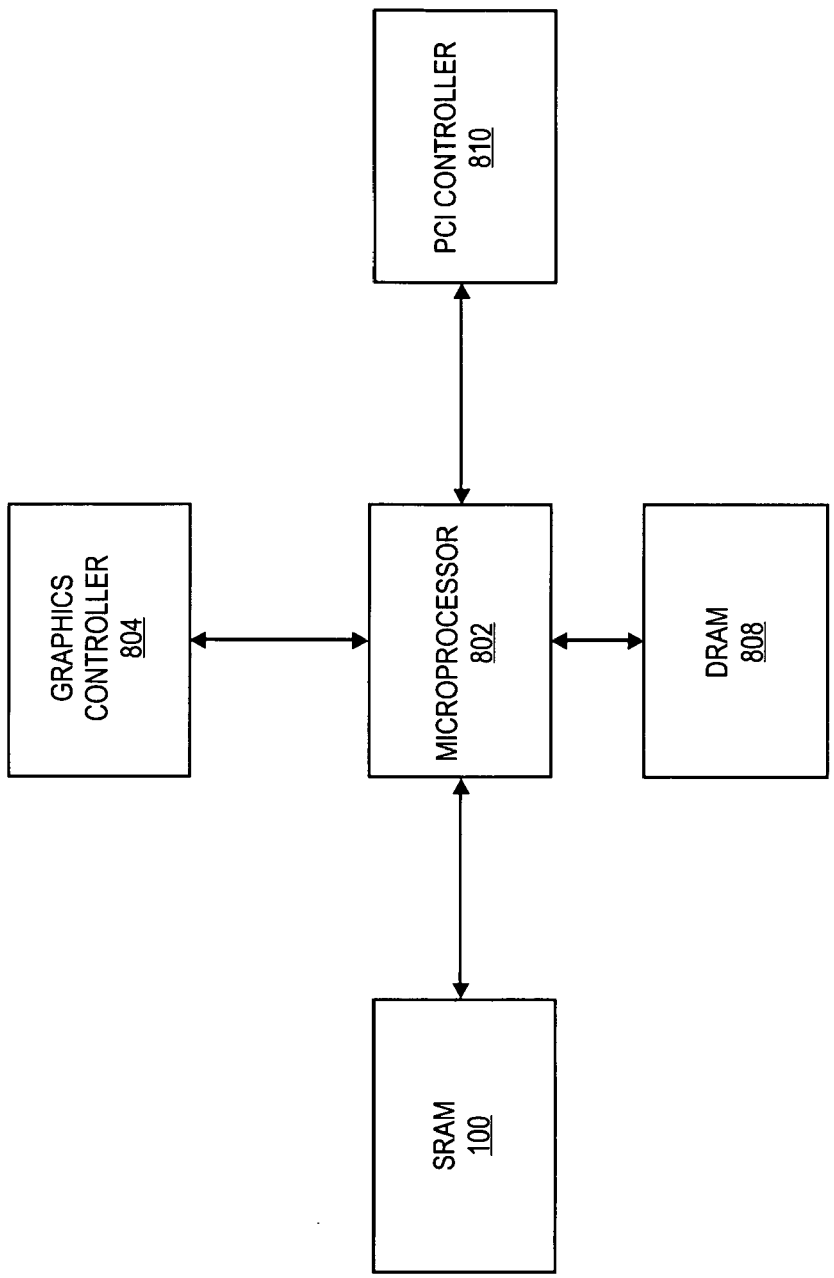

SIX-TRANSISTOR (6T) STATIC RANDOM ACCESS MEMORY (SRAM) WITH DYNAMICALLY VARIABLE P-CHANNEL METAL OXIDE SEMICONDUCTOR (PMOS) STRENGTH

BACKGROUND

1. Field

Embodiments of the present invention relate to integrated circuit devices and, in particular, to memory devices.

2. Discussion of Related Art

Memory devices may include read-only memory (ROM), random access memory (RAM). As the names suggest, ROM can be read whereas RAM can be read and written. RAM also differs from ROM in that when power is disconnected from RAM, the data stored in RAM is lost whereas when power is disconnected from ROM the data stored in ROM remains.

RAM may be dynamic RAM or static RAM. Dynamic RAM (DRAM) is a type of RAM that holds its data if it is continuously refreshed. Static RAM (SRAM) is a type of RAM that holds its data without external refresh as long as power is supplied to the SRAM device. Traditional SRAM devices have limitations, however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 8 is a high-level block diagram of a computer system according to an embodiment of the present invention.

DETAILED DESCRIPTION OF THE ILLUSTRATED EMBODIMENTS

Figure 1:
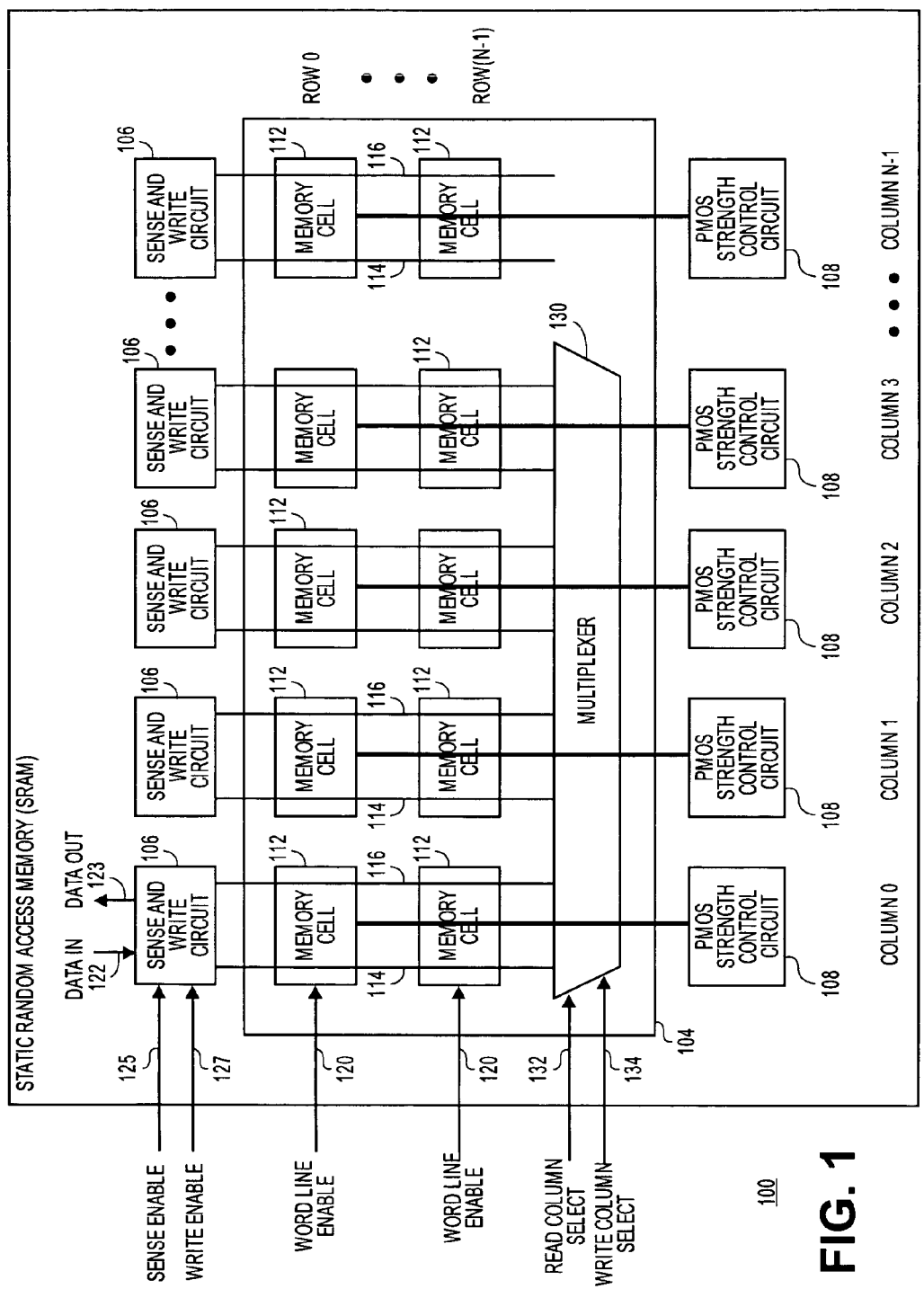
FIG. 1 is a high-level schematic diagram of a static random access memory (SRAM) device according to an embodiment of the present invention.

FIG. 1 is a high-level schematic diagram of a static random access memory (SRAM) 100 according to an embodiment of the present invention. In the illustrated embodiment, the SRAM 100 includes a memory cell array 104 coupled to several sense and write circuits 106 and several programmable p-channel metal oxide semiconductor (PMOS) strength control circuits 108.

The illustrated memory cell array 104 includes several columns (column 0, column 1, column 2, and column 3 through column N) and several rows (row 0 through row N). An individual column includes several memory cells 112 coupled to a bit line 114 and a complement bit line 116. An individual row is coupled to a word line enable line 120. In embodiments, the bit lines 114 and 116 are complementary such that when data is written to a memory cell 112 via a bit line 114 the data's complement is written to the memory cell 112 via the complement bit line 116. Signals on the word line enable lines 120 may determine which memory cell(s) 112 are to be selected for reading and writing.

In one embodiment, an individual sense and write circuit 106 includes a sense amplifier (not shown), an operational write circuit (not shown), a data in line 122, a data out line 123, a sense enable line 125, and a write enable line 127. In embodiments, data may be written to a memory cell 112 via the data in lines 122 and the sense and write circuits 106. Operational write circuits in the sense and write circuits 106 may differentially write data to a memory cell 112 via the bit lines 114 and the complement bit lines 116. The write enable signal 127 may enable the operational write circuits. In other embodiments, data may be read from a memory cell 112 via the data out lines 123 and the sense and write circuits 106. Sense amplifiers in the sense and write circuits 106 may differentially sense data on the bit lines 114 and the complement bit lines 116 during read operations.

In the illustrated embodiment, the memory cell array 104 includes a multiplexer 130 that may select one of the columns to read from or write to based on a signal on a read column select line 132 or a signal on a write column select line 134, respectively. For simplicity sake, four columns are shown as being coupled to the multiplexer 130, which may be a four-by-one multiplexer. Similarly, only two rows of memory cells 112 are shown as being in the memory cell array 104. However, in embodiments of the present invention there may be more rows and columns of memory cells 112 as well as other multiplexers 130 coupled to multiplex the columns in the SRAM 100.

An individual memory cell 112 may have a wide aspect ratio such that the memory cell has its own ground ($V_{SS}$) line, running vertically in the bit line direction, for example.

The example SRAM 100 may form part of a cache memory, such as a first level cache (L1) and/or a second level cache (L2) of a computer system (shown in FIG. 8). Alternatively, the SRAM 100 may be internal to a processor and/or an external device. Alternatively still, the SRAM 100 may be associated with any computer system that makes use of an SRAM.

In one embodiment, the SRAM 100 may be in a READ mode. In READ mode, the SRAM 100 may be performing operations to read data from one or more memory cells 112. In READ mode, the word lines 120 may be active or asserted.

In one embodiment, the SRAM 100 may be in a WRITE mode. In WRITE mode, the SRAM 100 may be performing operations to write data to one or more memory cells 112. In WRITE mode, the word lines 120 may be active or asserted.

In one embodiment, the SRAM 100 may be in a STANDBY or NO-OP mode. In STANDBY or NO-OP mode, the SRAM 100 may be performing no operations and standing by to enter the READ mode or the WRITE mode. In STANDBY or NO-OP mode, the word lines 120 may be inactive or de-asserted.

Figure 2:
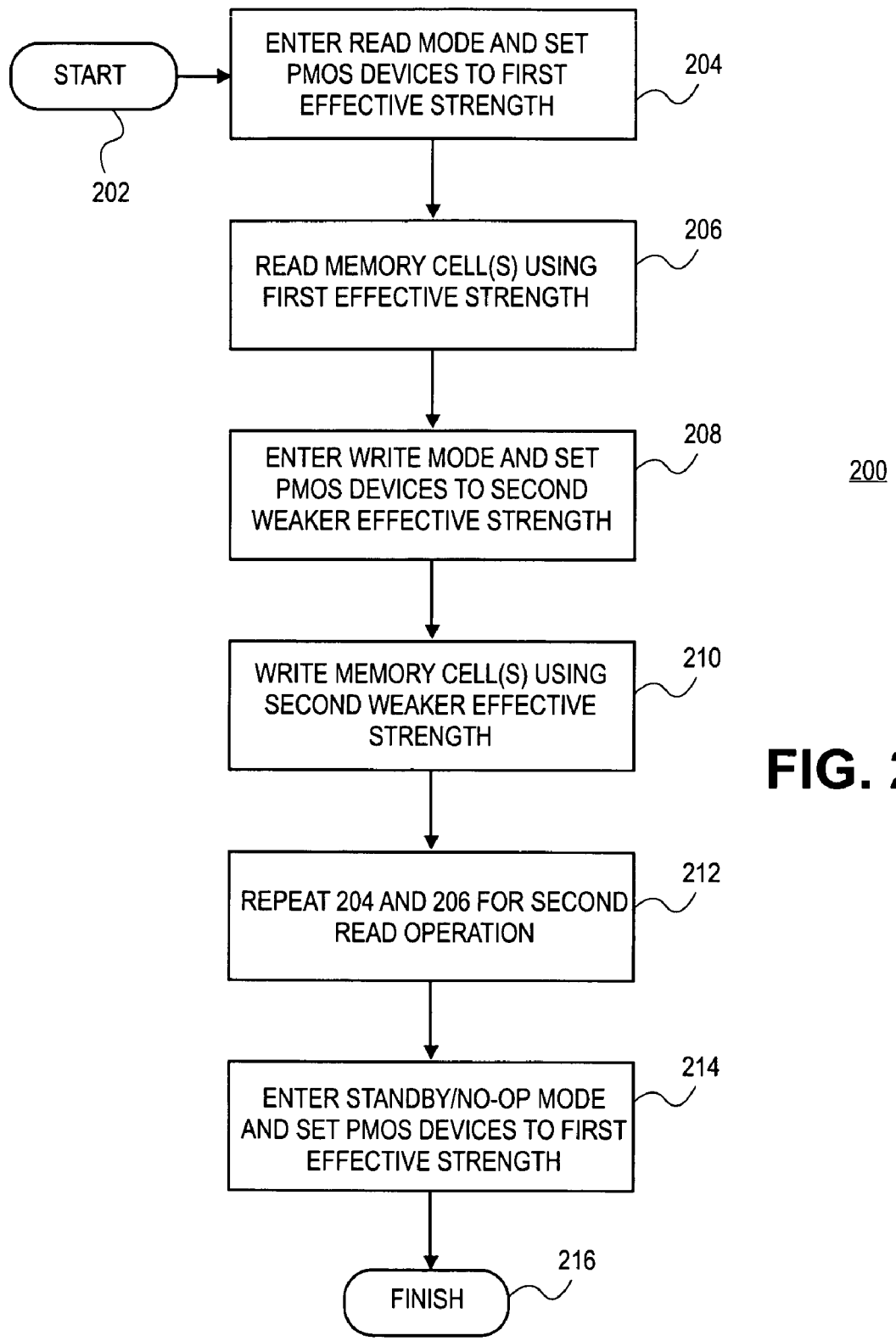
FIG. 2 is a flowchart illustrating an approach to operating a SRAM device according to an embodiment of the present invention.
Figure 3:
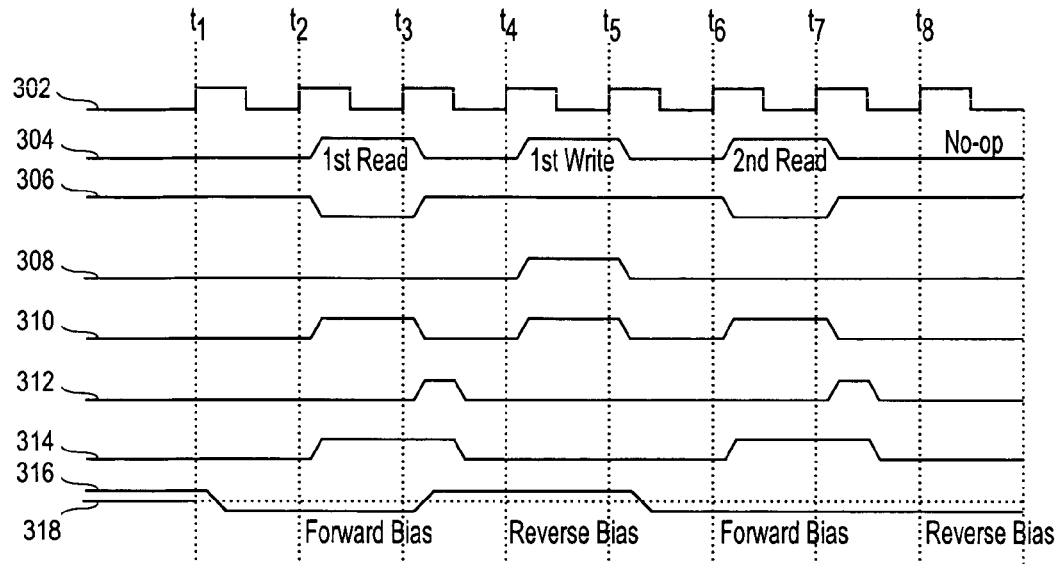
FIG. 3 is a timing diagram that illustrates operation of a SRAM device according to an embodiment of the present invention.

FIG. 2 is a flowchart illustrating a process 200 implemented by the SRAM 100 according to an embodiment of the present invention. The operations of the process 200 are described with reference to FIG. 3, which is a timing diagram 300 that illustrates operation of the SRAM 100 in READ, WRITE, and/or STANDBY/NO-OP modes. The timing diagram 300 includes a clock signal 302, a word line enable signal 304, a read column select signal 306, a write column select signal 308, a bit line pre-charge signal 310, a sense amplifier enable signal 312, a sense amplifier pre-charge signal 314, an n-well bias signal 316, and a array supply voltage ($V_{CC}$) 318.

Figure 4:
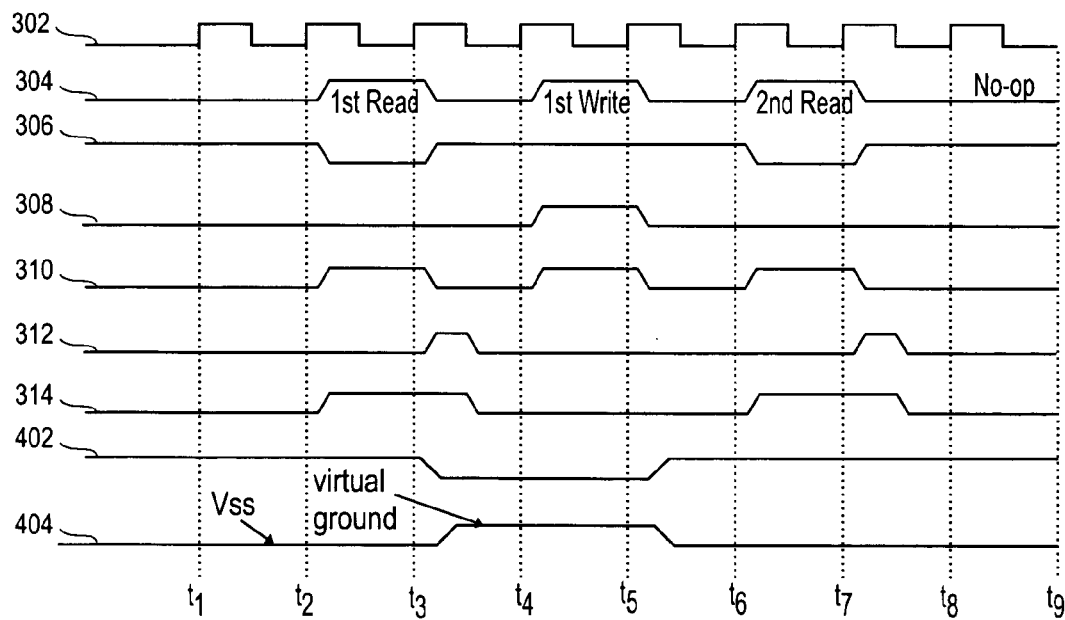
FIG. 4 is a timing diagram that illustrates operation of a SRAM device according to an alternative embodiment of the present invention.

The operations of the process 200 are described with reference to FIG. 4, which is a timing diagram 400 that illustrates operation of the SRAM 100 in READ, WRITE, and/or STANDBY/NO-OP modes according to an alternative embodiment of the present invention. FIG. 4 includes additionally a signal 402 (described in more detail below) and a signal 404, whose value modulates between virtual ground ($V_{SSi}$) and ground ($V_{SS}$). In one embodiment, virtual ground ($V_{SSi}$) may be one hundred millivolts (100 mV).

The operations of the process 200 are described with reference to FIG. 5, which is a schematic diagram illustrating the PMOS strength control circuit 108 according to an embodiment of the present invention. In the example embodiment shown in FIG. 5, column 0 includes a multiplexer 502 to couple a Vn-well_high voltage or a Vn-well_low voltage to the n-well of the memory cells 112 in column 0 via a line 514. When the multiplexer 502 couples Vn-well_high voltage or Vn-well_low voltage to the n-wells of the memory cells 112 in column 0 via a line 514, the memory cell 112 voltage remains at the array supply voltage ($V_{CC}$) 318.

Figure 5:
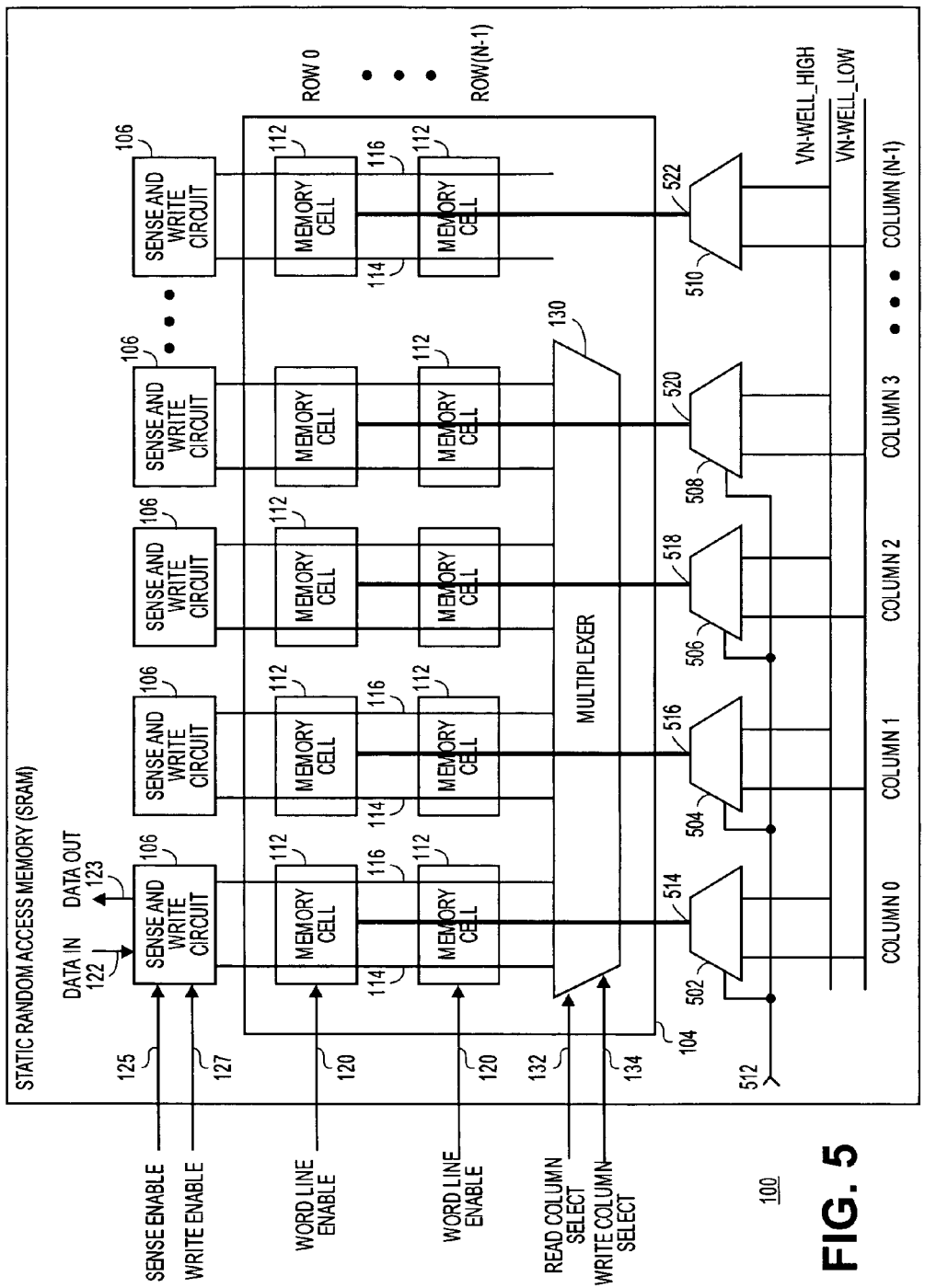
FIG. 5 is a high-level schematic diagram of a static random access memory (SRAM) device according to an embodiment of the present invention.

Also illustrated in FIG. 5, column 1 includes a multiplexer 504 to couple Vn-well_high voltage and Vn-well_low voltage to the n-wells of the memory cells 112 in column 1 via a line 516, column 2 includes a multiplexer 506 to couple Vn-well_high voltage or Vn-well_low voltage to the n-wells of the memory cells 112 in column 2 via a line 518, column 3 includes a multiplexer 508 to couple Vn-well_high voltage or Vn-well_low voltage to the n-wells of the memory cells 112 in column 3 via a line 520, and column N includes a multiplexer 510 to couple Vn-well_high voltage or Vn-well_low voltage to the n-wells of the memory cells 112 in column N via a line 522. When the multiplexers 504, 506, 508, and 510 couple Vn-well_high voltage or Vn-well_low voltage to the n-wells of the memory cells 112 in the respective column, the memory cell 112 voltage also remains at the array supply voltage ($V_{CC}$) 318. The lines 514, 516, 518, 520, and 522 may run vertically in the bit line direction, for example.

In an embodiment, a strength control signal 512 may determine whether Vn-well_high voltage or Vn-well_low voltage is coupled to the n-wells of the memory cells 112. Also, the read column select signal 132 and/or the write column select signal 134 may determine which column is coupled to Vn-well_high voltage and/or Vn-well_low voltage.

The operations of the process 200 are described with reference to FIG. 6, which is a schematic diagram illustrating the PMOS strength control circuit 108 according to an alternative embodiment of the present invention. In the example embodiment shown in FIG. 6, column 0 includes devices 602 and 604 to couple ground ($V_{SS}$) or virtual ground ($V_{SSi}$) to the memory cells 112 in column 0. For example, if the device 602 is "off" and the device 604 is "on," then a node 620 is at virtual ground ($V_{SSi}$), which is coupled to the memory cells 112 in column 0. If both devices 602 and 604 are "on," then the node 620 is at ground ($V_{SS}$), which is coupled to the memory cells 112 in column 0.

Figure 6:
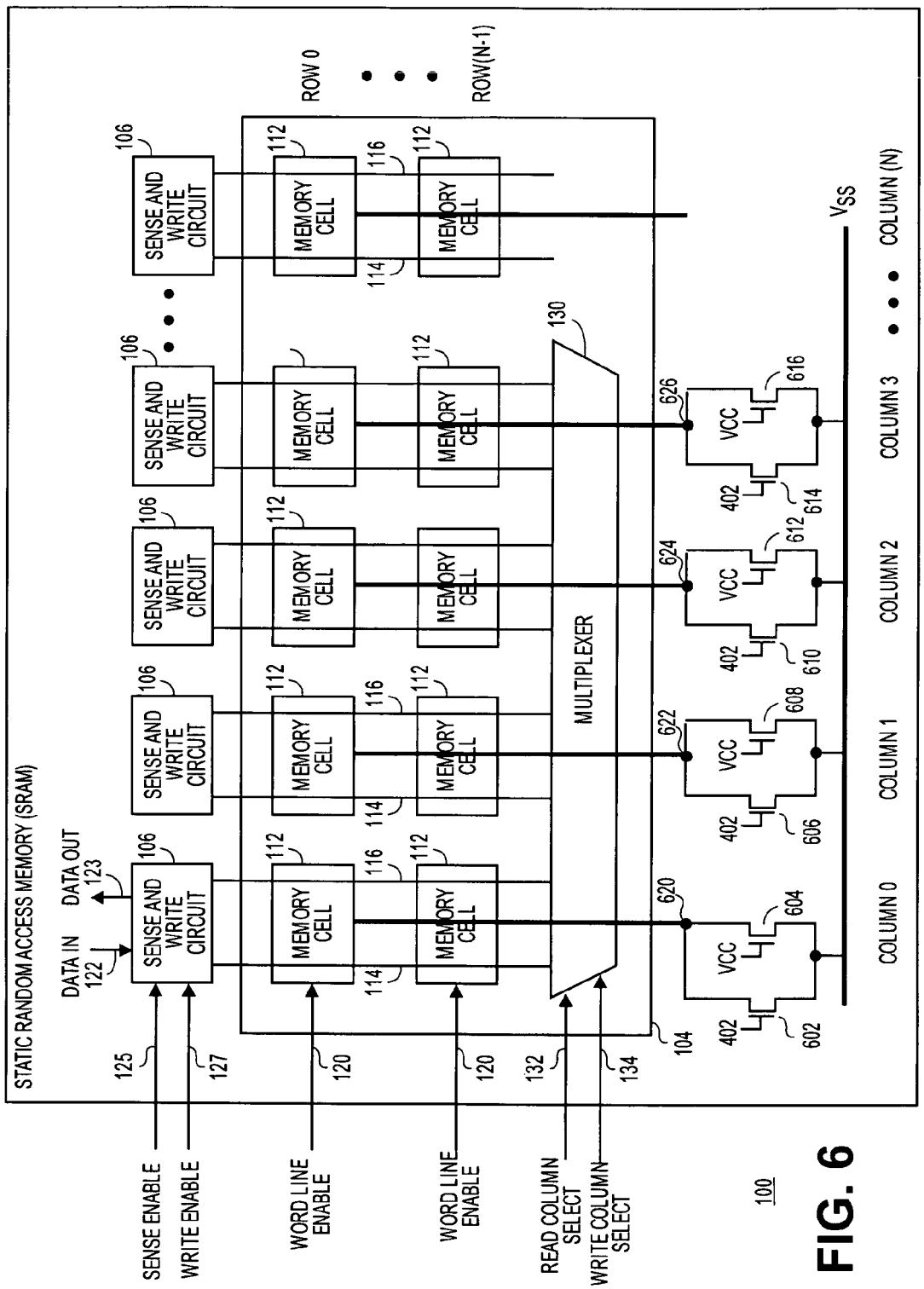
FIG. 6 is a high-level schematic diagram of a static random access memory (SRAM) device according to an alternative embodiment of the present invention.

Also illustrated in FIG. 6, column 1 includes devices 606 and 608 to couple ground ($V_{SS}$) or virtual ground ($V_{SSi}$) to the memory cells 112 in column 1 via a node 622, column 2 includes devices 610 and 612 to couple ground ($V_{SS}$) or virtual ground ($V_{SSi}$) to the memory cells 112 in column 2 via a node 624, and column 3 includes devices 614 and 616 to couple ground ($V_{SS}$) or virtual ground ($V_{SSi}$) to the memory cells 112 in column 3 via a node 626. Although not shown for simplicity sake, column N also includes active devices to couple ground ($V_{SS}$) or virtual ground ($V_{SSi}$) to the memory cells 112 in column N. The signal 404 illustrates the value on the nodes 620, 622, 624, and/626.

In one embodiment, the transistors 602, 606, 610, and 614 are much larger than the transistors 604, 608, 612, and 616. In one embodiment, the transistors 602, 606, 610, and 614 may be a few hundred microns and the transistors 604, 608, 612, and 616 may be a few or tens of microns.

Figure 7:
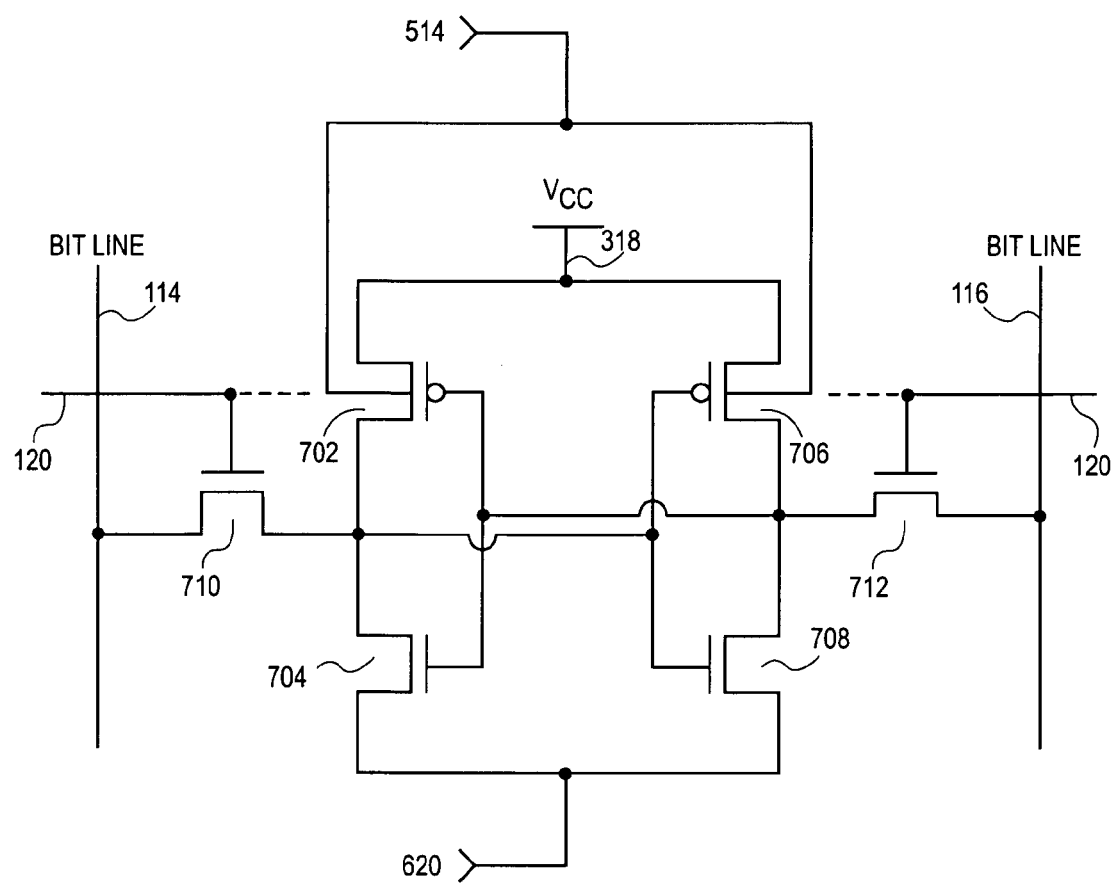
FIG. 7 is a schematic diagram of SRAM cell circuitry according to an embodiment of the present invention.

The operations of the process 200 are described with reference to FIG. 7, which is a schematic diagram of circuitry included in the SRAM cell 112 and interacting with the PMOS strength control circuit 108 according to an embodiment of the present invention. In the embodiment illustrated in FIG. 7, a six-transistor (6T) memory cell 112 from column 0 is shown, and includes p-channel metal oxide semiconductor (PMOS) pull-up device 702 and n-channel metal oxide semiconductor (NMOS) pull-down device 704, which form an inverter, cross-coupled to another inverter formed by PMOS pull-up device 706 and NMOS pull-down device 708, and pass gates 710 and 712. The bodies of the PMOS devices 702 and 706 are coupled to Vn-well_high voltage or Vn-well_low via the line 514. The sources of the NMOS devices 704 and 708 are coupled to ground ($V_{SS}$) or virtual ground ($V_{SSi}$) via the node 620. In embodiments of the present invention, the remaining memory cells 112 in column 0 and the memory cells 112 in the remaining columns are substantially similar to the memory cell 112 depicted in FIG. 7.

In one embodiment, the PMOS pull-up devices 702 and 706 are fabricated to have a threshold voltage that is smaller than standard six-transistor (6T) SRAM PMOS pull-up devices. This may be accomplished using a lower halo dopant implant than that used in standard 6T SRAM PMOS pull-up devices.

In an alternative embodiment, the NMOS devices 704 and 708 are fabricated to have a threshold voltage that is greater than standard six-transistor (6T) SRAM NMOS pull-down devices. This may be accomplished using a higher halo dopant implant through an extra implant mask.

Referring back to FIG. 2, the operations of the process 200 are described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented.

Of course, the process 200 is an example process and other processes may be used to implement embodiments of the present invention. A machine-accessible medium with machine-readable data thereon may be used to cause a machine, for example, a processor to perform the process 200.

In a block 202, the process 200 starts, where control passes to block 204.

In the block 204, the SRAM 100 enters READ mode and the PMOS pull-up devices in the memory cells 112 are set to a first effective strength. In one embodiment, between approximately t1 and t2 the word line enable signal 304 is de-asserted, the read column select signal 306 is de-asserted, the write column select signal 308 is de-asserted, the bit line pre-charge signal 310 is asserted and the bit lines 114 and 116 are pre-charged, the sense amplifier enable signal 312 is de-asserted, the sense amplifier pre-charge signal 314 is asserted to pre-charge the sense amplifiers in the sense and write circuits 106, and the n-well bias signal 316 goes to a value below the value of the array supply voltage ($V_{CC}$) 318.

Between approximately t2 and t3, the word line enable signal 304 is asserted to select a row (such as, for example, row 0), the read column select signal 306 is asserted to select one or more columns (such as, for example, columns 0-N), the bit line pre-charge signal 310 is de-asserted and the bit lines 114 and 116 may float to prepare to sense (read) data from the memory cell 112, and the sense amplifier pre-charge signal 314 is de-asserted. Vn-well_low voltage may be coupled to the n-wells of the PMOS devices 702 and 706 in row 0, columns 0-N via the signal 514.

In one embodiment, the strength control signal 512 may have a value of 1111 . . . 1, for example, to select the multiplexers 502, 504, 506, 508, and 510 to be coupled to Vn-well_low voltage. Coupling Vn-well_low voltage to the n-wells of the PMOS devices 702 and 706 forward body biases the PMOS devices 702 and 706 and increases the effective strength of the PMOS devices 702 and 706. For example, in response to the forward biasing the n-wells, the PMOS devices 702 and 706 have greater drive current and conduct harder than if their n-wells were not forward biased.

In an alternative embodiment, between approximately t1 and t2 the word line enable signal 304 is de-asserted, the read column select signal 306 is de-asserted, the write column select signal 308 is de-asserted, the bit line pre-charge signal 310 is asserted and the bit lines 114 and 116 are pre-charged, the sense amplifier enable signal 312 is de-asserted, the sense amplifier pre-charge signal 314 is asserted to pre-charge the sense amplifiers in the sense and write circuits 106, and the signal 402 is asserted to apply a "1" to the gates of the devices 602, 606, 610, and 614, which turns "on" the devices 602, 606, 610, and 614. In response to the devices 602, 606, 610, and 614 being turned "on," the value on the nodes 620, 622, 624, and 626 is at ground ($V_{SS}$), as illustrated by the signal 404.

Between approximately t2 and t3, the word line enable signal 304 is asserted to select a row (such as, for example, row 0), the read column select signal 306 is asserted to select the columns (such as, for example, columns 0-N), the bit line pre-charge signal 310 is de-asserted and the bit lines 114 and 116 may float to sense (read) data or write data to the memory cell 112, and the sense amplifier pre-charge signal 314 is de-asserted. In response to the device 602 being turned "on" and the device 604 already being "on" because its gate is coupled to the array supply voltage ($V_{CC}$) 318, node 620 and thus the sources of the NMOS devices 704 and 708 are coupled to ground ($V_{SS}$).

In response to the NMOS devices 704 and 708 having their sources coupled to ground ($V_{SS}$), the effective strength of the PMOS devices 702 and 706 increases. For example, the PMOS devices 702 and 706 have greater drive current and conduct harder than if the sources of the NMOS devices 704 and 708 were coupled to a potential other than ground ($V_{SS}$).

In a block 206, one or more memory cells 112 are read using the first effective strength. In one embodiment, between approximately t3 and t4, the sense amplifier enable signal 312 is asserted and the sense amplifier in the sense and write circuit 106 reads data in the memory cell 112.

In the illustrated embodiment, the signal 316, which may be a two-cycle signal, arrives at the memory cell 112 one cycle of the clock signal 302 ahead of actual access of the memory cell 112. The first cycle of the signal 316 forward body biases the PMOS devices 702 and 706. The second cycle of the signal 316 overlaps with the actual read access such that reading from the memory cell 112 occurs with the n-wells of the devices 702 and 706 coupled to Vn-well_low voltage via the line 514, for example.

In a block 208, the SRAM 100 enters WRITE mode and the PMOS pull-up devices in the columns in the memory cell array 104 are set to a second effective strength. In one embodiment, between approximately t3 and t4, the word line enable signal 304 is de-asserted, the read column select signal 306 is de-asserted, the bit line pre-charge signal 310 is asserted and the bit lines 114 and 116 are pre-charged, the sense amplifier enable signal 312 is de-asserted, the sense amplifier pre-charge signal 314 is asserted to pre-charge the operational write circuitry in the sense and write circuits 106, and the strength control signal 316 goes to a value above the value of the array supply voltage ($V_{CC}$) 318.

Between approximately t4 and t5, the word line enable signal 304 is asserted to select a row (such as, for example, row 0), the read column select signal 306 is de-asserted, the write column select signal 308 is asserted to select a column (such as, for example, column 0), the bit line pre-charge signal 310 is de-asserted and the bit lines 114 and 116 may float to prepare to write data to the memory cell 112.

Vn-well_high voltage may be coupled to the body of the PMOS devices 702 and 706 in row 0, column 0, and Vn-well_low voltage may be coupled to the n-wells of the PMOS devices 702 and 706 in the remaining columns. In one embodiment, the strength control signal 512 may have a value of 1000 . . . 0, for example, to select the PMOS devices 702 and 706 in row 0, column 0 to be coupled to Vn-well_high voltage and to select the PMOS devices 702 and 706 in the remaining rows to be coupled to Vn-well_low voltage.

Coupling Vn-well_high voltage to the n-wells of the PMOS devices 702 and 706 in column 0 reverse body biases the PMOS devices 702 and 706 in column 0 and decreases the effective strength of the PMOS devices 702 and 706 in column 0. For example, in response to the reverse body bias, the PMOS devices 702 and 706 in column 0 have less drive current and do not conduct as hard as they would if their n-wells were not reversed biased. Coupling Vn-well_low voltage to the body of the PMOS devices 702 and 706 in the remaining columns maintains the forward body bias on the PMOS devices 702 and 706 in the column that are not being written.

In an alternative embodiment, between approximately t3 and t4, the word line enable signal 304 is de-asserted, the read column select signal 306 is de-asserted, the bit line pre-charge signal 310 is asserted and the bit lines 114 and 116 are pre-charged, the sense amplifier enable signal 312 is de-asserted, the sense amplifier pre-charge signal 314 is asserted to pre-charge the operational write circuitry in the sense and write circuits 106. The signal 402 is de-asserted to apply a "0" to the gate of the device 602, which turns "off" the device 602. The signal 402 is maintained asserted for the remaining columns such that a "1" is applied to the gates of the devices 606, 610, and 614, which keeps "on" the devices 606, 610, and 614.

Between approximately t4 and t5, the word line enable signal 304 is asserted to select a row (such as, for example, row 0), the read column select signal 306 is de-asserted, the write column select signal 308 is asserted to select a column (such as, for example, column 0), the bit line pre-charge signal 310 is de-asserted and the bit lines 114 and 116 may float to prepare to write data to one or more memory cells 112 in column 0.

In response to the device 602 being turned "off" and the device 604 being "on," node 620 and thus the sources of the NMOS devices 704 and 708 in column 0 are coupled to virtual ground ($V_{SSi}$). In response to the devices 606, 610, and 614 remaining "on," nodes 622, 624, and 626 and thus the sources of the NMOS devices 704 and 708 in columns 1 through N are coupled to ground ($V_{SS}$) and the effective strength of the PMOS devices 702 and 706 in columns 1 through N remains at the first effective strength. For example, the PMOS devices 702 and 706 in column 0 have less drive current and do not conduct as hard as the PMOS devices 702 and 706 in columns 1 through N and the effective strength of the PMOS devices 702 and 706 in column 0 in WRITE mode is less than the effective strength of PMOS devices 702 and 706 in columns 1-N in READ mode.

In a block 210, the memory cell(s) 112 in column 0 are written to using the second effective strength.

In the illustrated embodiment, the signal 402, which may be a two-cycle signal, arrives at the memory cell 112 one cycle of the clock signal 302 ahead of actual access of the memory cell 112. The first cycle of the signal 402 turns "off" the transistor 602 and charges up the memory cell 112 in column 0 to virtual ground ($V_{SSi}$). The second cycle of the signal 402 overlaps with the actual write access such that writing to the memory cell 112 occurs with the node 620 at virtual ground ($V_{SSi}$), for example.

In a block 212, the blocks 204 and 206 may be repeated for a second READ operation of the SRAM 100 between approximately t5 through t6.

In a block 214, the SRAM 100 enters STANDBY/NO-OP mode and the PMOS pull-up devices in the memory cells 112 may be set to the first effective strength. In one embodiment, between approximately t7 and t8 the word line enable signal 304 is de-asserted, the read column select signal 306 is de-asserted, the write column select signal 308 is de-asserted, the bit line pre-charge signal 310 is asserted and the bit lines 114 and 116 are pre-charged, the sense amplifier enable signal 312 is de-asserted, the sense amplifier pre-charge signal 314 is asserted to pre-charge the sense amplifiers in the sense and write circuits 106, and the n-well bias signal 316 goes to a value below the value of the array supply voltage ($V_{CC}$) 318.

Vn-well_low voltage may be coupled to the n-wells of the PMOS devices 702 and 706 in row 0, columns 0-N to forward body bias the PMOS devices 702 and 706 and increase the effective strength of the PMOS devices 702 and 706 in STANDBY/NO-OP mode to an effective strength that is greater than the effective strength of the PMOS devices 702 and 706 in WRITE mode.

In a block 216, the process 200 finishes.

FIG. 8 is a high-level block diagram of a computer system 800 according to an embodiment of the present invention. In the illustrated embodiment, the computer system 800 includes a microprocessor 802 coupled to a graphics controller 804, SRAM 100, a dynamic random access memory (DRAM) device 808, and a peripheral component interconnect (PCI) controller 810.

The system 800 may be a high-performance desktop, a workstation, a server, etc. In one embodiment the system 800 is a UNIX platform. In other embodiments, the system 800 may be Windows® or Windows® NT platform.

The microprocessor 802 may be any suitable microprocessor that performs conventional functions of executing programming instructions including implementing many embodiments of the present invention. The microprocessor 802 can be a processor of the Pentium® processor family available from Intel Corporation of Santa Clara, Calif., but might be any suitable processor.

The graphics controller 804 may be any suitable graphics controller that receives commands and data and generates display signals (e.g., in RGB format).

The illustrated DRAM device 808 may be any suitable DRAM device that store data (pixels, frames, audio, video, etc.) and software (control logic, instructions, code, computer programs, etc.) for access by other system 800 components. In one embodiment, the microprocessor also may be coupled to flash memory (not shown).

The PCI controller 810 may be any suitable PCI controller that interfaces memory to a PCI bus hierarchy. Suitable PCI controllers include PCI-X controllers and PCI-Xpress controllers.

Embodiments of the present invention may be implemented using hardware, software, or a combination thereof. In implementations using software, the software may be stored on a machine-accessible medium.

A machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), as recess as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, recess-known structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
a static random access memory (SRAM) cell having a first p-channel metal oxide semiconductor (PMOS) device and a second p-channel metal oxide semiconductor (PMOS) device, the first and the second p-channel metal oxide semiconductor (PMOS) devices being operated at a first current level in a read mode of the static random access memory (SRAM) cell and being operated at a second lower current level in a write mode of the static random access memory (SRAM) cell; and
a first and a second n-channel metal oxide semiconductor (NMOS) devices corresponding to the first and the second p-channel metal oxide semiconductor (PMOS) devices,
wherein the first and the second p-channel metal oxide semiconductor (PMOS) devices are forward body biased in the read mode and sources of the n-channel metal oxide semiconductor (NMOS) devices are coupled to ground via a first control device and a second control device, respectively,
wherein the first and the second p-channel metal oxide semiconductor (PMOS) devices are reverse body biased in the write mode or sources of the n-channel metal oxide semiconductor (NMOS) devices are coupled to a virtual ground via the first and the second control devices.

2. The apparatus of claim 1, wherein the first and the second p-channel metal oxide semiconductor (PMOS) devices are operated at the first current level in a standby mode of the static random access memory (SRAM) cell.

3. The apparatus of claim 1, wherein the first and/or the second control devices/device include/includes a first transistor and a second transistor, the first transistor in the first and/or the second control devices/device being significantly larger than the second transistor in the first and/or the second control devices/device.

4. The apparatus of claim 3, wherein the first transistor is to be off and the second transistor is to be on in write mode.

5. The apparatus of claim 3, wherein the first and the second transistors are to be on in read mode.

6. A method, comprising:
operating a pair of p-channel metal oxide semiconductor (PMOS) devices in a memory cell at a first current level in a read mode of the memory cell;
operating the pair of p-channel metal oxide semiconductor (PMOS) devices in the memory cell at a second lower current level in a write mode of the memory cell;
operating the pair of p-channel metal oxide semiconductor (PMOS) devices in the memory cell at the, first current level in a standby mode of the memory cell;
applying a first bias voltage to n-wells of individuals of the pair of p-channel metal oxide semiconductor (PMOS) devices in the read mode or the standby mode, and a second bias voltage to n-wells of individuals of the pair of the p-channel metal oxide semiconductor (PMOS) devices in the write mode; and
applying a first bias voltage less than a memory cell supply voltage to n-wells of individuals of the pair of n-channel metal oxide semiconductor (PMOS) devices in the read mode or the standby mode, and a second bias voltage greater than the memory cell supply voltage to the n-wells of individuals of the pair of p-channel metal oxide semiconductor (PMOS) devices in the write mode.

7. The method of claim 6, further comprising
applying ground to sources of a pair of n-channel metal oxide semiconductor (NMOS) devices corresponding to the pair of n-channel metal oxide semiconductor (NMOS) devices in the read mode or the standby mode; and
applying a virtual ground to the sources of the pair of n-channel metal oxide semiconductor (NMOS) devices in the write mode.

8. A method, comprising:
operating a pair of p-channel metal oxide semiconductor (PMOS) devices in a memory cell at a first current level in a read mode of the memory cell;
operating the pair of p-channel metal oxide semiconductor (PMOS) devices in the memory cell at a second lower current level in a write mode of the memory cell;
operating the pair of p-channel metal oxide semiconductor (PMOS) devices in the memory cell at the first current level in a standby mode of the memory cell;
applying a first bias voltage to n-wells of individuals of the pair of p-channel metal oxide semiconductor (PMOS) devices in the read mode or the standby mode, and a second bias voltage to n-wells of individuals of the pair of p-channel metal oxide semiconductor (PMOS) devices in the write mode;
applying ground to sources of a pair of n-channel metal oxide semiconductor (NMOS) devices corresponding to the pair of n-channel metal oxide semiconductor (NMOS) devices in the read mode or the standby mode; and
applying a virtual ground to the sources of the pair of n-channel metal oxide semiconductor (NMOS) devices in the write mode.

* * * * *